United States Patent [19]

Adham et al.

[11] Patent Number: 5,313,469
[45] Date of Patent: May 17, 1994

[54] SELF-TESTABLE DIGITAL INTEGRATOR

[75] Inventors: Saman Adham, Kanata; Janusz Rajski, Montreal West; Jerzy Tyszer, Montreal; Mark Kassab, Westmount, all of Canada

[73] Assignee: Northern Telecom Limited, Montreal, Canada

[21] Appl. No.: 75,629

[22] Filed: Jun. 11, 1993

[51] Int. Cl.⁵ .............................................. G01R 31/28
[52] U.S. Cl. ...................................... 371/22.1; 371/27; 364/733
[58] Field of Search .................... 371/22.1, 22.5, 15.1, 371/27; 324/158 R, 73.1, 733

[56] References Cited

U.S. PATENT DOCUMENTS

| | | | |
|---|---|---|---|
| 4,754,215 | 6/1988 | Kawai | 371/27 |
| 4,841,466 | 6/1989 | Christopher | 364/733 |
| 4,862,404 | 8/1989 | Schwartz et al. | 364/733 |
| 4,884,206 | 11/1989 | Mate . | |
| 5,148,167 | 9/1992 | Ribner | 341/143 |
| 5,189,675 | 2/1993 | Nozuyama et al. | 371/22.1 |
| 5,260,946 | 11/1993 | Numally | 371/22.1 |

OTHER PUBLICATIONS

A use of Double Integration in sigma Delta Modulation, James C. Candy, IEEE Transactions on Communications, vol. COM-33, No. 3, Mar. 1985.
Decimation for Sigma Delta Modulation, James C. Candy, IEEE Transactions on Communications, vol. COM-34, No. 1, Jan. 1986.
Accumulator-Based Compaction of Test Responses, Janusz Rajski and Jerzy Tyszer, Department of Electrical Engineering, McGill University, Montreal, Canada. H3A 2A7 (accepted for publication in IEEE Transactions on Computers, May 22, 1992).
The Analysis of Digital Integrators for Test Response Compaction, Janusz Rajski and Jerzy Tyszer, IEEE Transactions on Circuits and Systems-II, Analog and Digital Signal Processing, vol. 39, No. 5, May 1992.
Accumulator-Based Compaction for Built-In Self Test of Data-Path Architectures, Mark Kassab, Janusz Rajski and Jerzy Tyszer, Department of Electrical Engineering, McGill University, Montreal, Canada. H3A 2A7.
Test Responses Compaction in Accumulators with Rotate Carry Aders, Janusz Rajski and Jerzy Tyszer, IEEE Transactions on Computer-Aided Design of Integrated Circuits and Systems, vol. 12, No. 4, Apr. 1993.
Iztok Lesjak 'Voice and Data Integration in HDLC Environment' Q4-12-4-16 1989 (IEEE).
Tadasu Uchiyama 'A Modified Leaky Integrator Network for Temporal Pattern Processing' PPI 469-475 IEEE.

Primary Examiner—Robert W. Beausoliel, Jr.
Assistant Examiner—Albert Decady
Attorney, Agent, or Firm—C. W. Junkin

[57] ABSTRACT

A self-testable digital integrator comprises binary adding apparatus and storage apparatus. The adding apparatus and the storage apparatus are functionally interconnected such that the storage apparatus feeds digital words to the adding apparatus for addition thereof and the adding apparatus feeds resulting digital words to the storage apparatus for storage thereof to perform a digital integration operation. The digital integrator further comprises a first combinational network responsive to a first state of a test mode signal to feed an external input signal to the adding apparatus for integration thereof, and responsive to a second state of the test mode signal to feed to the adding apparatus a test pattern signal derived from selected bias of the digital words fed from the adding apparatus to the storage apparatus. The digital integrator also comprises a second combinational network responsive to the second state of the test mode signal to feed back a carry-out bit of the adding apparatus to a carry-in port of the adding apparatus for test result compaction. The digital integrator optionally comprises a third combinational network responsive to the second state of the test mode signal to feed a carry-out bit of the adding apparatus to the first combinational network, the first combinational network being responsive to the second state of the test mode signal and to the carry-out bit to modify the test pattern signal. The self-testable digital integrator is particularly useful as a component of a digital decimator used to decimate Double Integration Sigma Delta modulation signals.

19 Claims, 7 Drawing Sheets

SELF-TESTABLE DIGITAL INTEGRATOR

FIELD OF THE INVENTION

This invention relates to self-testable digital integrators and to self-test methods for digital integrators.

BACKGROUND OF THE INVENTION

Digital integrated circuits constructed according to conventional Built In Self Test (BIST) architectures comprise dedicated test circuitry in addition to operational circuitry required to perform functions expected of the integrated circuits in their intended applications. The dedicated test circuitry normally includes test pattern generators for generating test patterns, test response compactors for compressing results of test pattern application to the operational circuitry, and multiplexors used to switch between normal operating configurations and test configurations. The dedicated test circuitry can add a substantial hardware overhead, and introduction of the multiplexors into signal paths used during normal operation of the integrated circuits can degrade normal operation of the integrated circuits.

Some functional blocks of integrated circuits are difficult to test even using BIST techniques. For example, digital integrators of digital decimators used to band limit Sigma Delta Modulation (SDM) signals are difficult to test because digital words applied to the decimators are limited to only two possible differential values. A test pattern comprising only such digital words must be very long to ensure that the probability of making internal faults of the digital integrator observable is high enough for practical applications.

SUMMARY OF THE INVENTION

This invention is intended to provide a self-testable digital integrator having a modest hardware overhead for test pattern generation and test response compaction. Preferred embodiments of the invention are intended to provide improved observability of potential faults.

Accordingly, one aspect of the invention provides a self-testable digital integrator comprising adding apparatus for performing binary addition of digital words and storage apparatus for storing digital words. The adding apparatus and the storage apparatus are functionally interconnected such that the storage apparatus feeds digital words to the adding apparatus for addition thereof and the adding apparatus feeds resulting digital words to the storage apparatus for storage thereof to perform a digital integration operation. The digital integrator further comprises a first combinational network which is responsive to a first state of a test mode signal to feed an external input signal to the adding apparatus for integration thereof, and responsive to a second state of the test mode signal to feed to the adding apparatus a test pattern signal derived from selected bits of the digital words fed from the adding apparatus to the storage apparatus. The digital integrator also comprises a second combinational network responsive to the second state of the test mode signal to feed back a carry-out bit of the adding apparatus to a carry-in port of the adding apparatus, and responsive to the first state of the test mode signal to block such feedback.

Thus, circuitry of the digital integrator which is used in normal operation of the digital integrator to perform the integration function is used in test mode to generate a test pattern signal for testing the digital integrator and to compact test results. Consequently, the hardware overhead required for test pattern generation and test response compaction is modest.

The self-testable digital integrator may further comprise a third combinational network responsive to the second state of the test mode signal to feed a carry-out bit of the adding apparatus to the first combinational network, the first combinational network being responsive to the second state of the test mode signal and to the carry-out bit to modify the test pattern signal.

Thus, test patterns including digital words other than the limited range of digital words available in normal operation of the digital integrator are available for test purposes, making more efficient testing possible.

This invention is also intended to provide methods for testing digital integrators which require a modest hardware overhead for test pattern generation and test response compaction. Preferred methods are intended to provide improved observability of potential faults.

Thus, another aspect of the invention provides a method for self-testing a digital integrator, the digital integrator comprising adding apparatus for performing binary addition of digital words and storage apparatus for storing digital words, the adding apparatus and the storage apparatus being functionally interconnected such that the storage apparatus feeds digital words to the adding apparatus for addition thereof and the adding apparatus feeds resulting digital words to the storage apparatus for storage thereof to perform a digital integration operation. The method comprises deriving a test pattern signal from selected bits of digital words fed from the adding apparatus to the storage apparatus while feeding back a carry-out bit of the adding apparatus to a carry-in port of the adding apparatus and feeding the test pattern signal to the adding apparatus.

The method may further comprise modifying the test pattern signal in response to a carry-out bit of the adding apparatus.

BRIEF DESCRIPTION OF THE DRAWINGS

Embodiments of the invention are described below by way of example only. Reference is made to accompanying drawings in which.

DETAILED DESCRIPTION OF EMBODIMENTS

Figure 1:
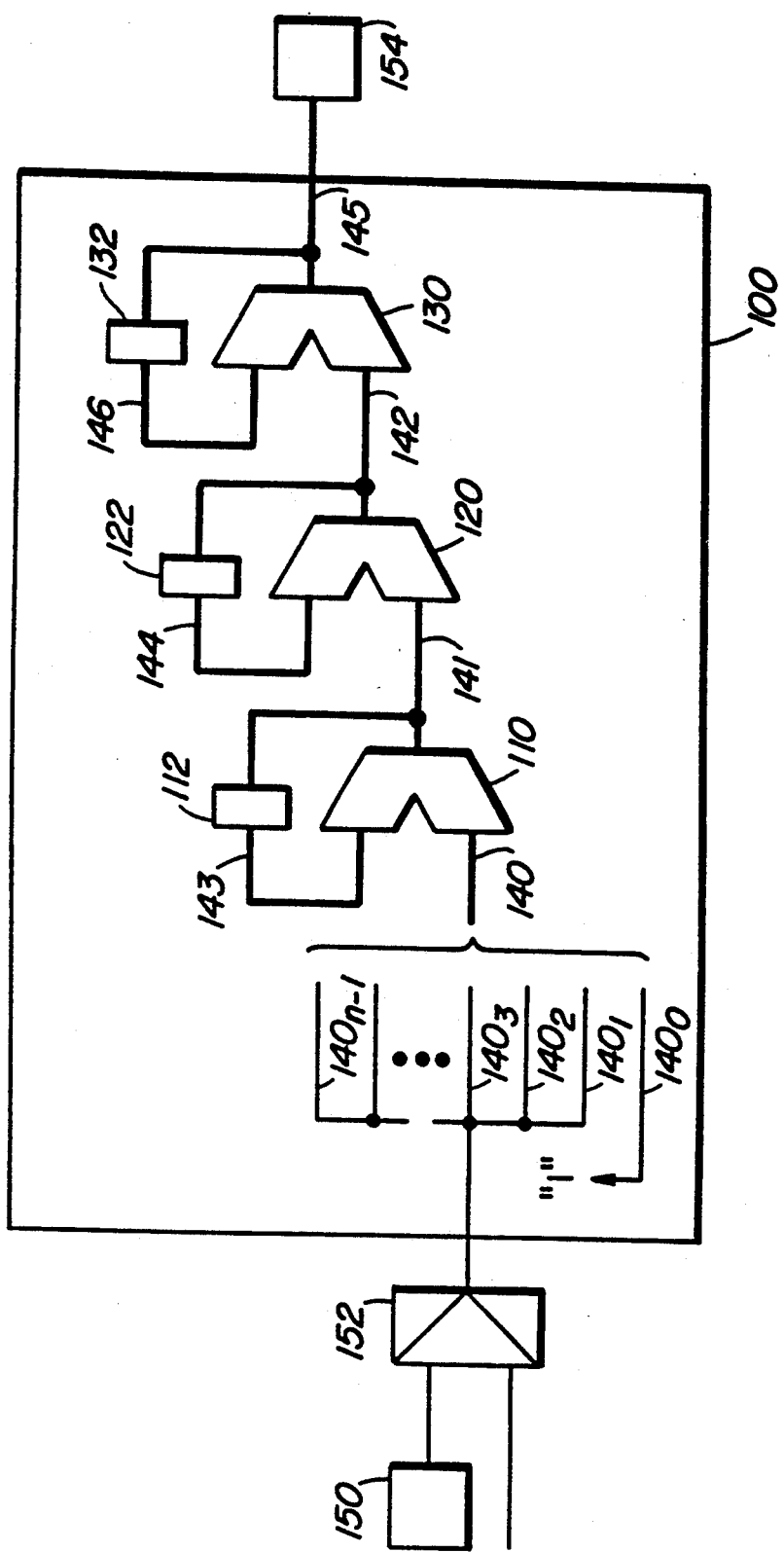
FIG. 1 is a block schematic diagram of a conventional digital integrator for use in decimating a sigma-delta modulated signal.
Figure 2A:
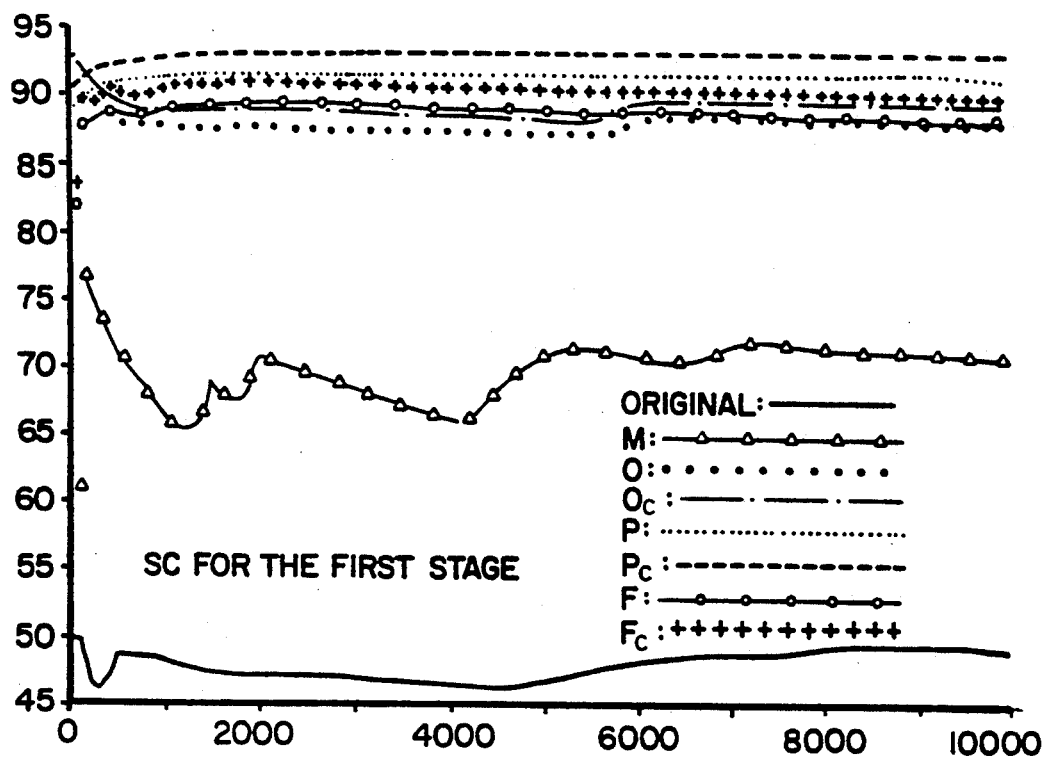
FIG. 2 is a series of plots 2a-2f showing state coverage and transition coverage as a function of test pattern length for the conventional digital integrator of FIG. 1 and for digital integrators according to embodiments of the invention shown in FIGS. 3-6.
Figure 2B:
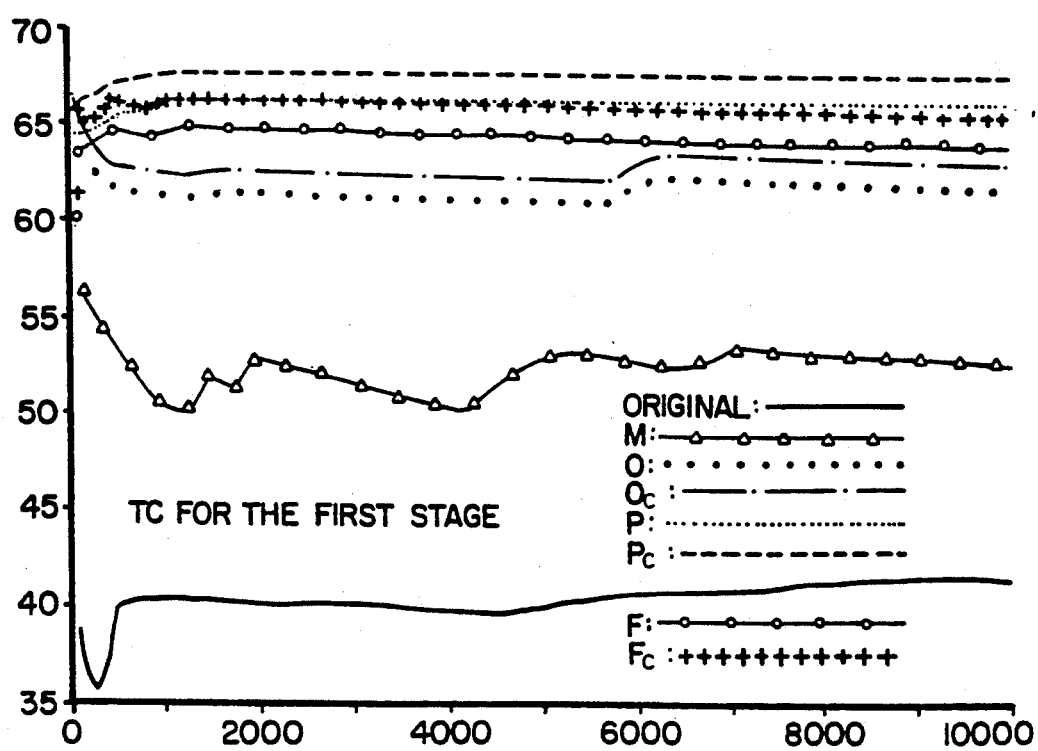
Figure 2C:
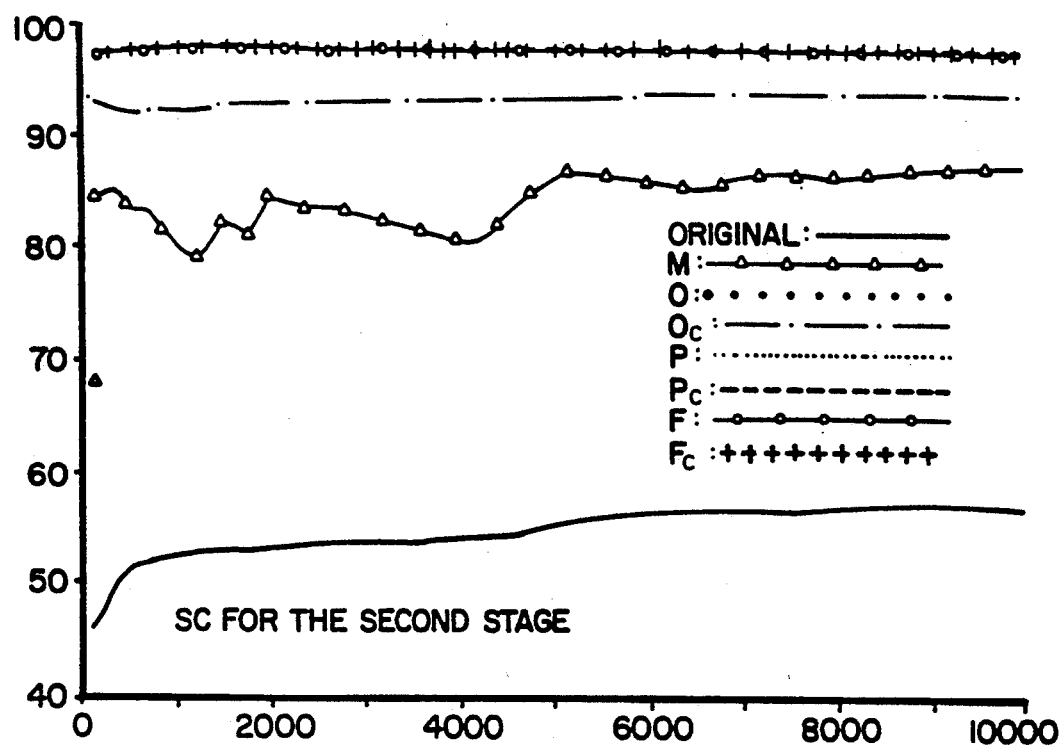
Figure 2D:
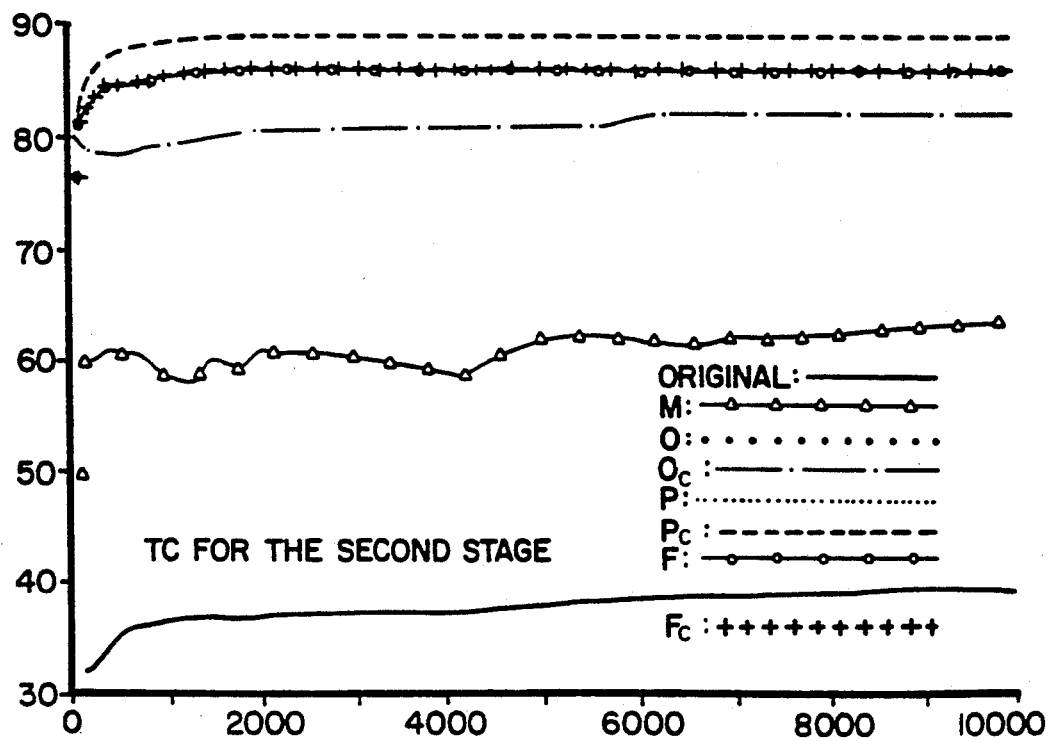
Figure 2E:
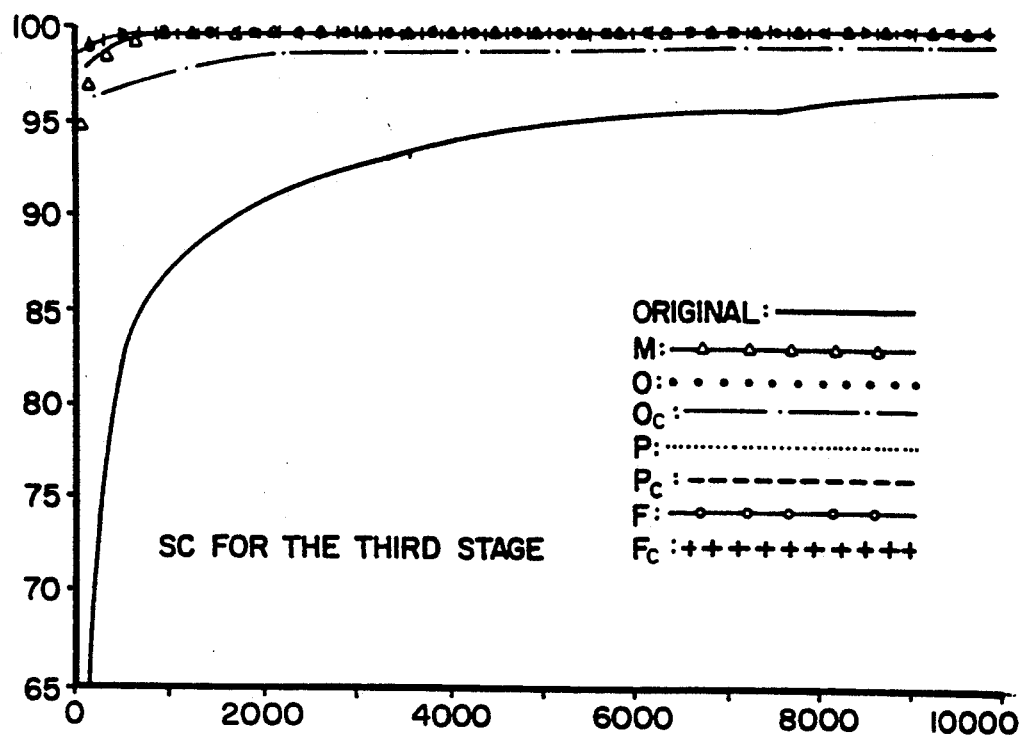
Figure 2F:
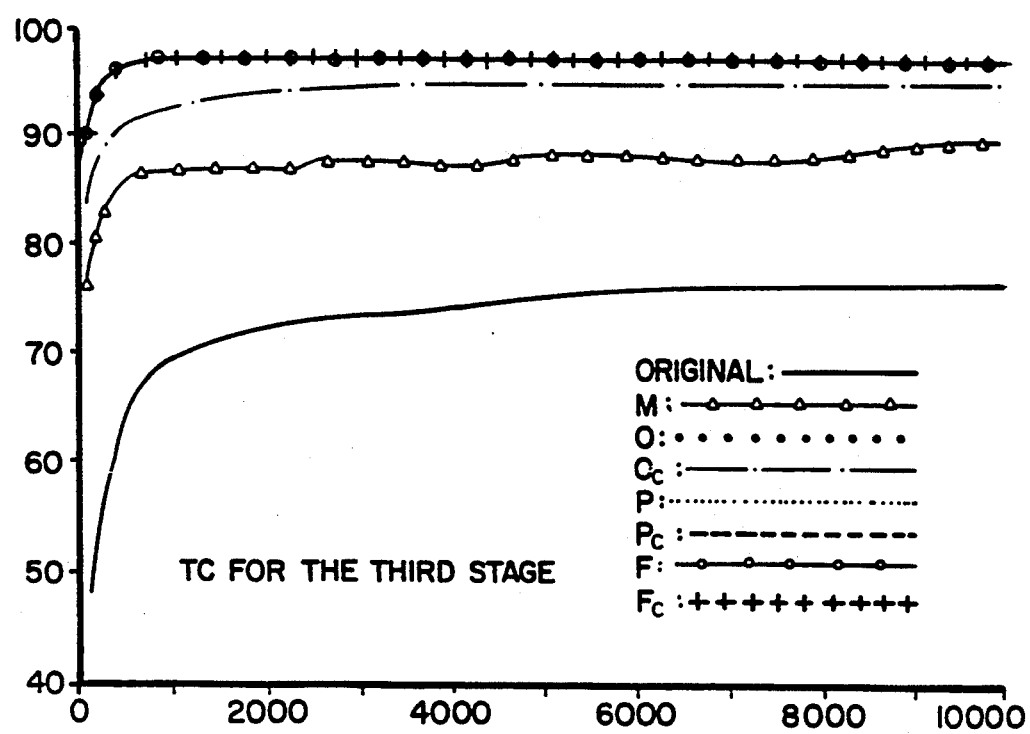

FIG. 1 is a block schematic diagram of a conventional digital integrator 100 commonly used for decimation of sigma-delta modulated signals. The conventional digital integrator 100 comprises a chain of three n-bit binary adders 110, 120, 130, each connected to a corresponding n-bit register 112, 122, 132. A first input bus 140 feeds a first input port of the first adder 110. A first output bus 141 connects an output port of the first adder 110 to a first input port of the second adder 120, and a second output bus 142 connects an output port of the second adder 120 to a first input port of the third adder 130. The first output bus 141 is also connected to the first register 112, and a first feedback bus 143 is connected from the first register 112 to a second input port of the first adder 110. The second output bus 142 is also connected to the second register 122, and a second feedback bus 144 is connected from the second register 122 to a second input port of the second adder 120. A third output bus 145 connects an output port of the third adder 130 to the third register 132, and a third feedback bus 146 connects the third register 132 to a second input port of the third adder 130. Each of the buses 140-146 is n bits wide.

Where the digital integrator 100 is used for decimation of sigma-delta modulated signals, the n-bit words applied to the first input port of the first adder 110 by the input bus 140 are restricted to n-bit words corresponding to differential values +1 or −1. The n-bit word corresponding to +1 has a logical 11, in the least significant bit and a logical "0" in all remaining bits. The n-bit word corresponding to −1 has a logical "1" in all n bits. Consequently, appropriate inputs to the first input port of the first adder 110 are generally arranged by permanently connecting a least significant bit line $1400$ of the input bus 140 to a source of a logical "1" and connecting all remaining bit lines $140_1$-$140_{n-1}$ of the input bus in parallel to an input line 148 supplying a variable signal for which a logical "0" corresponds to a +1 value and a logical "1" corresponds to a −1 value.

In conventional testing of the digital integrator 100, an external test pattern generator 150 would apply a test stimulus pattern to the input line 140 via a multiplexor 152 and an external test result analyzer 154 would analyze a corresponding test result pattern obtained from the third output bus 145. The test pattern generator 150 and the test result analyzer 154 could be provided by test equipment external to the integrated circuit comprising the digital integrator 100 or, according to conventional BIST architectures, could be provided on the same integrated circuit as the digital integrator 100. Alternatively, functions of the test pattern generator 150 and test result analyzer 154 could be partitioned between off-chip and on-chip functional blocks. Those functions of the test pattern generator 150 and the test result analyzer 154 which are implemented on-chip constitute a test hardware overhead which adds to the area and cost of the digital integrator 100.

Because of the limited range of input signals that can be applied to the digital integrator 100 via the input bus 140 and the highly sequential nature of the digital integrator's operation, a very long test pattern is required to ensure that the probability that potential faults internal to the adders 110, 120, 130 are made observable in the test results is high enough for practical applications. For example, it can be shown that, if the adders 110, 120, 130 are implemented as ripple-carry full adders, the length of test patterns required to make certain internal faults observable is proportional to $2^n$ where n is the number of bits in each digital word processed by the adders 110, 120, 130. As n is typically greater than 16 for digital integrators used for decimation of sigma-delta modulated signals, the test patterns required for adequate testing can be impractically long.

The observability of various malfunctions of the digital integrator 100 depends on the number of different bit sequences applied to each bit of each adder input port and on the relative frequencies with which they occur. Generally, the larger the number of different bit sequences which occur relatively frequently, the greater the number of faults that are likely to be observable in the test results. In other words, the test fault coverage for a given test length increases as the randomness of the test stimulation increases.

An overall measure of the randomness of test stimulation is the average entropy E given by:

$$E = \frac{1}{n} \sum_{i=0}^{n-1} \sum_{j \in S} p_{ij} \cdot \log_2\left(\frac{1}{p_{ij}}\right)$$

where $p_{ij}$ is the probability that a stimulus j is applied at the $i^{th}$ bit of an n-bit word and S is the code space of possible stimuli for application at each bit of each n-bit word. Each bit slice of each adder 110, 120, 130 has three inputs—one bit from each of the two words to be added and one carry bit from an adjacent bit slice. Thus, according to a simple analysis, S consists of $2^3 = 8$ combinations, and the state coverage, defined by SC=E/3, gives a comparative measure of test coverage. In an analysis which considers potential delay and transition faults, S consists of $8 \times 8 = 64$ possible combinations of two-vector sequences applied to each input port of each adder 110, 120, 130, and the transition coverage, defined by TC=E/6, gives a comparative measure of test coverage.

A random test pattern in which the two possible differential input signals are equally probable was applied to the input bus 140 in a Monte Carlo simulation to calculate the state coverage SC and the transition coverage TC as a function test pattern length for each of the three adders 110, 120, 130 of the digital integrator 100. The value of n (i.e. the number of bits in each digital word) was set at 22. The resulting values of SC and TC are plotted as solid lines in FIGS. 2a-2f.

Further simulations showed that the following percentages of single potential "stuck-at faults" in the adders 110, 120, 130 could be detected using the conventional BIST method as described above on the digital integrator 100:

| Number of Test Words | % of Faults Detected |
| --- | --- |
| 10 | 55 |
| 100 | 82 |
| 1000 | 93 |
| 10000 | 96 |

The fault coverage saturated at approximately 96% after 3223 test words.

Figure 3:
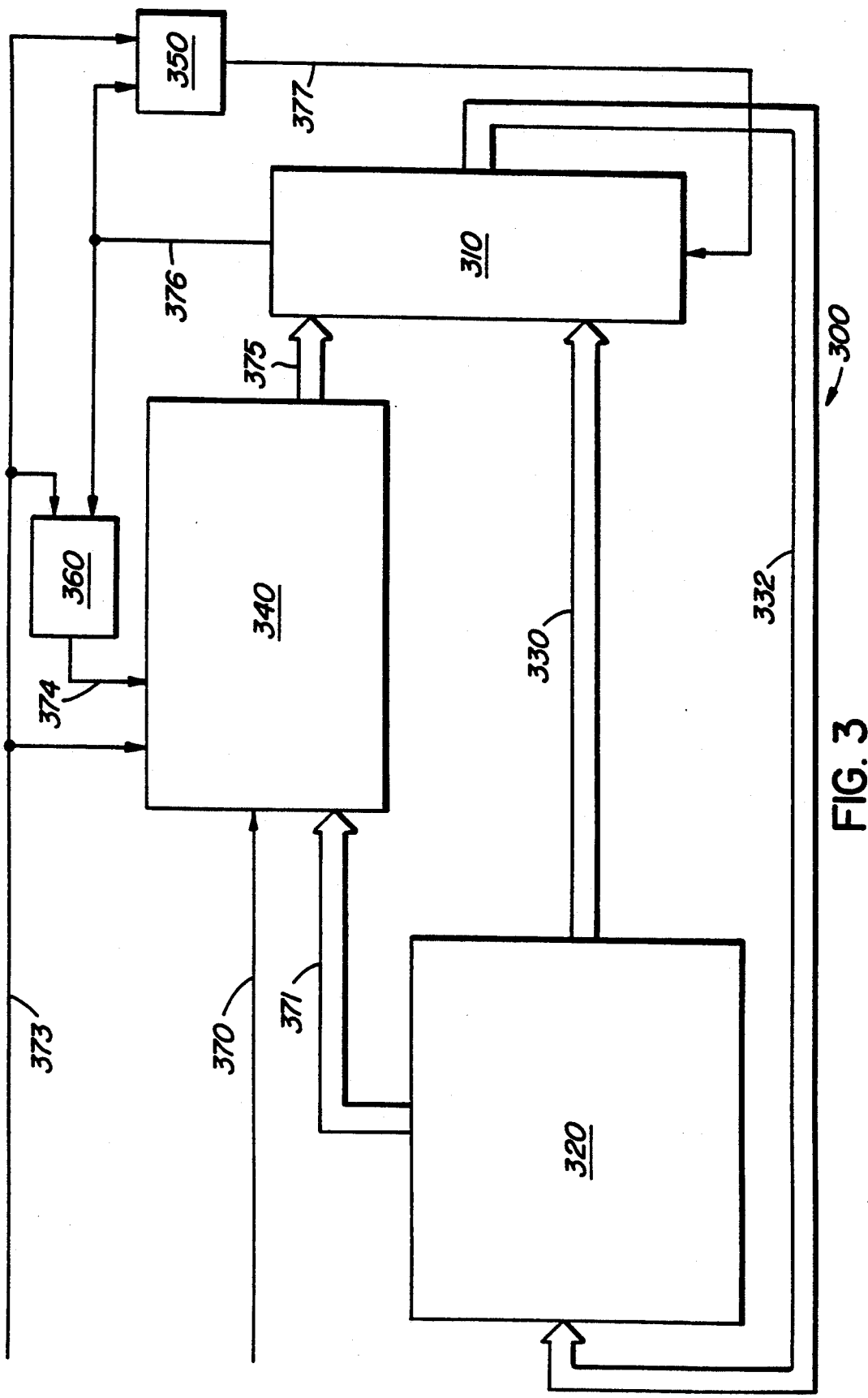
FIG. 3 is a block schematic diagram of a self-testable digital integrator according to an embodiment of the invention.

FIG. 3 is a block schematic diagram of a self-testable digital integrator 300 according to an embodiment of the invention. The digital integrator 300 comprises adding apparatus 310 for performing binary addition of n-bit digital words and storage apparatus 320 for storing n-bit digital words. The storage apparatus 320 feeds n-bit digital words to the adding apparatus 310 via a bus 330, and the adding apparatus adds those n-bit digital words and feeds resulting n-bit digital words to the storage apparatus 320 for storage via another bus 332.

The digital integrator 300 further comprises first, second and third combinational networks 340, 350, 360.

The first combinational network 340 receives an external input signal on an input line 370, receives on a bus 371 selected bits of the n-bit words fed via bus 332 from the adding apparatus 310 to the storage apparatus 320, receives a test mode signal on a test mode line 373, and receives a test pattern modification signal on a test pattern modification line 374 and feeds an output signal comprising n-bit digital words to the adding apparatus 310 via an adder input bus 375. The second combinational network 350 receives the test mode signal on the test mode line 373, a carry-out signal on a carry-out line 376 and feeds a signal to a carry-in port of the adding apparatus 310 via a carry-in line 377. The third combinational network 360 receives the test mode signal on the test mode line 373 and the carry-out signal from the adding apparatus 310 on the carry-out line 376, and feeds the test pattern modification signal to the first combinational network 340 on the test pattern modification line 374.

The first combinational network 340 responds to a first state of the test mode signal by feeding the external input signal to the adding apparatus 310 in the form of n-bit words. The second combinational network 350 responds to the first state of the test mode signal by blocking passage of the carry-out signal to the carry-in port of the adding apparatus 310. The functional interconnection of the adding apparatus 310 and the storage apparatus 320 is such that the digital integrator 300 performs a digital integration of the external input signal when the test mode signal is in its first state.

The third combinational network 360 responds to a second state of the test mode signal by applying the carry-out signal to the first combinational network 340. The first combinational network 340 responds to the second state of the test mode signal by deriving a test pattern signal from the selected bits received via bus 371 and by combining the test pattern signal with the carry-out signal to derive a modified test pattern signal for application to the adding apparatus 310 in the form of n-bit words. The second combinational network 350 responds to the second state of the test mode signal by passing the carry-out signal to the carry-in port of the adding apparatus 310 for compaction of a test result signal resulting from application of the test pattern signal to the adding apparatus 310.

Thus, the digital integrator 300 provides normal digital integration suitable for decimation of a sigma-delta modulated signal when the test mode signal is in its first state, and provides self-testing with integral test pattern generation and test result compaction when the test mode signal is in its second state.

Figure 4:
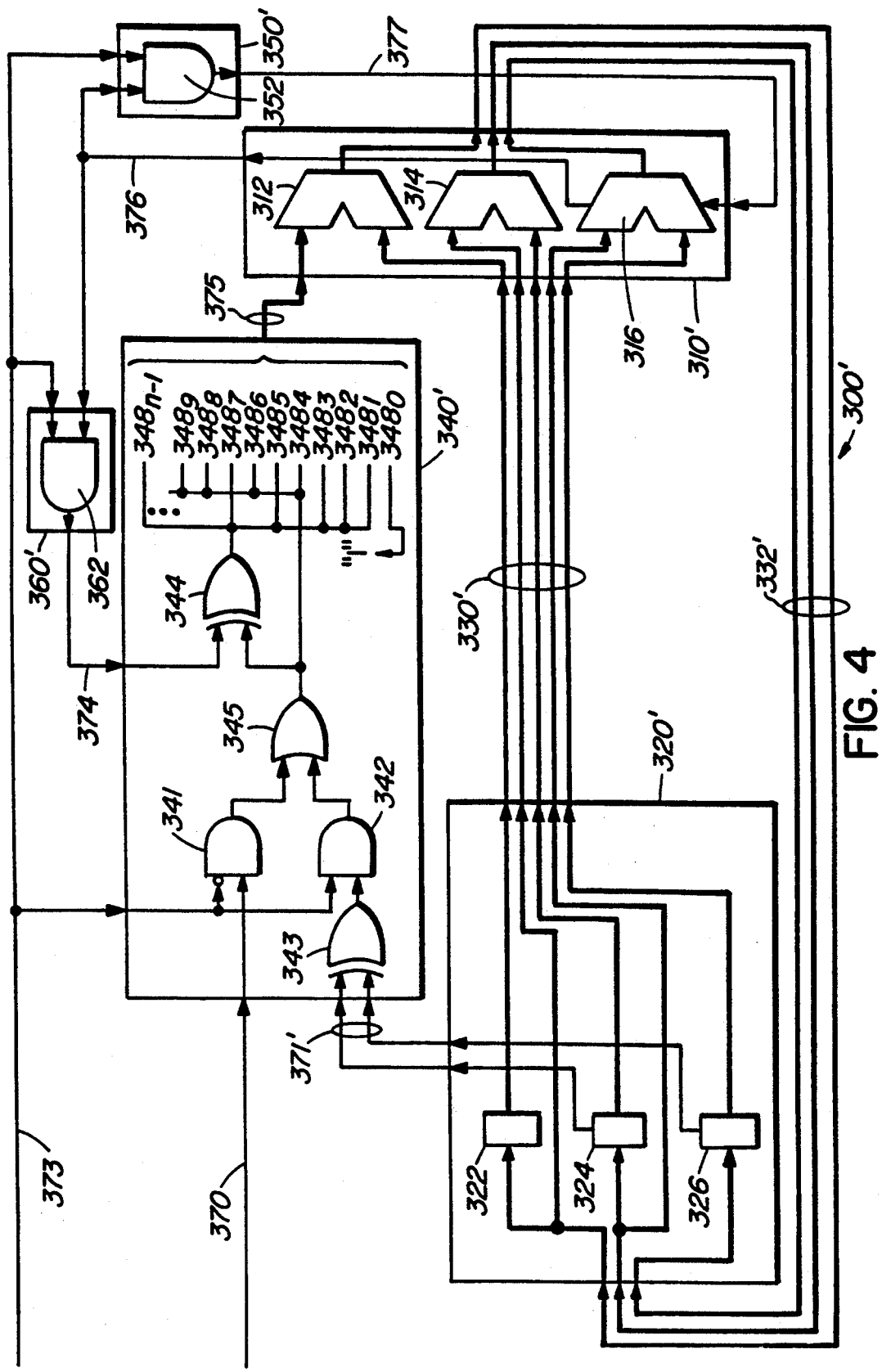
FIG. 4 is a block schematic diagram similar to FIG. 3 showing a first implementation for some of the functional blocks of FIG. 3.

FIG. 4 is a schematic diagram showing particular implementations 310', 320', 340', 350', 360' for the adding apparatus 310, the storage apparatus 320, and the combinational networks 340, 350, 360 in a digital integrator 300'. (In FIG. 4, heavy lines indicate buses which are n bits wide.)

The adding apparatus 310' comprises a chain of three n-bit binary adders 312, 314, 316, and the storage apparatus 320' comprises three corresponding n-bit registers 322, 324, 326. The first adder 312 has a first input port fed by the first combinational network 340' via the adder input bus 375, a second input port fed by its corresponding register 322 via bus 330' and an output port feeding its corresponding register 322 via bus 332'. The second adder 314 has a first input port fed by the output port of the first adder 312 via buses 330' and 332', a second input port fed by its corresponding register 324 via bus 330' and an output port feeding its corresponding register 324 via bus 332'. The third adder 316 has a first input port fed by the output port of the second adder 314 via buses 330, and 332', a second input port fed by its corresponding register 326 via bus 330' and an output port feeding its corresponding register 326 via bus 332'. This interconnection of adders 312, 314, 316 and registers 322, 324, 326 is similar to that shown in FIG. 1 for the conventional digital integrator 100.

The third combinational network 360' comprises an AND gate 362 which passes a carry-out bit from the third adder 316 to the first combinational network 340' when the test mode signal is a logical "1" and applies a logical "0" to the first combinational network 340' when the test mode signal is a logical "0".

The first combinational network 340' comprises first and second AND gates 341, 342, first and second exclusive-OR gates 343, 344 and an OR gate 345 connected as shown in FIG. 4. The first exclusive-OR gate 343 logically combines selected bits from the second and third registers 324, 326 to derive a pseudo-random signal for test pattern generation. The first and second AND gates 341, 342 and the OR gate 345 pass either the input signal on the input line 370 or the pseudo-random signal depending on the state of the test mode signal on the test mode line 373. The second exclusive-OR gate 344 modifies the signal passed by the AND and OR gates 341, 342, 345 when a logical "1" is present on the pattern modification line 374, and passes the signal without modification when a logical "0" is present on the pattern modification line 374.

The first combinational network 340' further comprises an output port comprising n output terminals $348_0$–$348_{n-1}$ one of the terminals $348_0$ supplies a bit permanently fixed at logical "1". Terminals $348_p$ for every prime number value of p less than n receive the signal which is selectively modified by the second exclusive-OR gate 344, and all other terminals $348_4$, $348_6$, $348_8$, $348_9$, etc. receive the unmodified signal directly from the OR gate 345.

Thus, when the test mode signal is a logical "0", the first combinational network 340' applies a logical "1" to output terminal 3480 and applies the signal received on the input line 340 to all other output terminals $348_1$–$348_{n-1}$. The resulting signal is passed as a series of n-bit words to the first input of the first adder 312 via the adder input bus 375, each n-bit word having one of the two admissible differential values for sigma-delta modulated signals, and is digitally integrated, the result of the integration being available at the output port of the third adder 316.

When the test mode signal is a logical "1", however, the first combinational network 340' blocks the signal received on the input line 340 and derives a pseudo-random test pattern signal from selected bits received on bus 371'. This pseudo-random test pattern signal is applied directly to some of the output terminals $348_1$–$348_{n-1}$, while a test pattern signal which is selectively modified according to the value of the carry-out bit is applied to others of the output terminals $348_1$–$348_{n-1}$. The resulting signal is passed as series of n-bit words to the first input of the first adder 312 via the adder input bus 375, some of the n-bit words differing from the two admissible differential values for sigma-delta modulated signals.

The second combinational network 350' comprises an AND gate 352 which passes a carry-out bit from the third adder 316 to a carry-in port of the third adder 316 when the test mode signal is a logical "1" and applies a logical "0" to the carry-in port of the third adder 316 when the test mode signal is a logical "0". Thus, the second combinational network 350' does not affect the normal operation of the digital integrator 300' when the test mode signal is a logical "0", but causes test result compaction when the test mode signal is a logical "1".

Consequently, the digital integrator 300' generates its own test patterns and compacts its own test results for a modest hardware overhead comprising the seven gates of the first, second and third combinational networks 340', 350', 360'. Moreover, the test patterns are not limited to the restricted signal space normally encountered in digital integrators used for decimation of sigma-delta modulated signals, and this wider range of test patterns potentially leads to faster identification of internal faults.

The state coverage SC and the transition coverage TC for the digital integrator 300' implemented as shown in FIG. 4 were calculated as a function of test pattern length and are plotted as dashed lines in FIGS. 2a-2f. Comparison with the corresponding quantities for the conventional digital integrator 100 shows that both the state coverage SC and the transition coverage TC are significantly better for the digital integrator 300' than for the conventional digital integrator 100 at each of the first, second and third adders 312, 314, 316.

Further simulations showed that the following percentages of single potential "stuck-at faults" in the adders 312, 314, 316 could be detected using the improved BIST method as described above on the digital integrator 100:

| Number of Test Words | % of Faults Detected |
| --- | --- |
| 10 | 94 |
| 100 | 100 |
| 1000 | 100 |
| 10000 | 100 |

The fault coverage reached 100% of testable faults after only 16 test words. Thus, the improved BIST method provides an increased fault coverage at a test length which is more than 200 times shorter than the test length required for fault coverage saturation using conventional BIST methods on the conventional digital integrator 100.

While the first combinational network 340' is connected in series with the adding apparatus 310', it does not degrade the operating speed of the digital integrator 300' when the first adder 312 is implemented as a ripple-carry full adder because the propagation delay of the input signal through gates 341, 344, 345 of the first combinational network 340' is essentially the same as the propagation delay of the feedback signal from the first register 322 through three similar gates of the $0^{th}$ bit slice of the ripple-carry full adder.

The implementation of the digital integrator 300' shown in FIG. 4 can be modified without departing from the principles of the invention as claimed below. For example, the third combinational network 360' could simply pass the test mode signal so that modification of the test pattern signal is determined only by the connections of the output terminals $348_1$-$348_{n-1}$ to the gates 344, 345 of the first combinational network 340' without any dependence on a carry-out bit. The connections of the output terminals $348_1$-$348_{n-1}$ to the gates 344, 345 of the first combinational network 340' could also be modified.

The following modifications were simulated for comparison purposes:

Designation Conditions

M—middle output terminal only connected to gate 344, no dependence of test pattern on carry-out bit.

Mc—middle output terminal only connected to gate 344, test pattern dependent on carry-out bit.

O—Even numbered output terminals (i.e. $348_2$, $348_4$, $348_6$, etc. ) connected to gate 344, no dependence of test pattern on carry-out bit.

Oc—Even numbered output terminals (i.e. $348_2$, $348_4$, $348_6$, etc. ) connected to gate 344, test pattern dependent on carry-out bit.

P—Output terminals corresponding to prime numbers (i.e. $348_1$, $348_2$, $348_3$, $348_5$, $348_7$, etc. ) connected to gate 344, no dependence of test pattern on carry-out bit.

Pc—Output terminals corresponding to prime numbers (i.e. $348_1$, $348_2$, $348_3$, $348_5$, $348_7$, etc.) connected to gate 344, test pattern dependent on carry-out bit.

F—Every fourth output terminal (i.e. $348_2$, $348_6$, $348_{10}$, etc.) connected to gate 344, no dependence of test pattern on carry-out bit.

Fc—Every fourth output terminal (i.e. $348_2$, $348_6$, $348_{10}$, etc.) connected to gate 344, test pattern dependent on carry-out bit.

The state coverages SC and transition coverages TC were calculated for each of these modifications, and the calculated values are plotted as a function of test pattern length in FIGS. 2a-2f. Comparison with the corresponding quantities for the conventional digital integrator 100 shows that both the state coverages SC and the transition coverages TC are significantly better than for the conventional digital integrator 100 in every case.

The single "stuck-at fault" coverage was also simulated for each of these modifications with the following results:

| Designation | Number of Test Words for 100% Fault Coverage |
| --- | --- |
| M | 17 |
| Mc | 46 |
| O | 13 |
| Oc | 16 |
| P | 123 |
| Pc | 16 |
| F | 33 |
| Fc | 21 |

Comparison with the corresponding quantities for the conventional digital integrator 100 shows a significant reduction in test length in every case.

Figure 5:
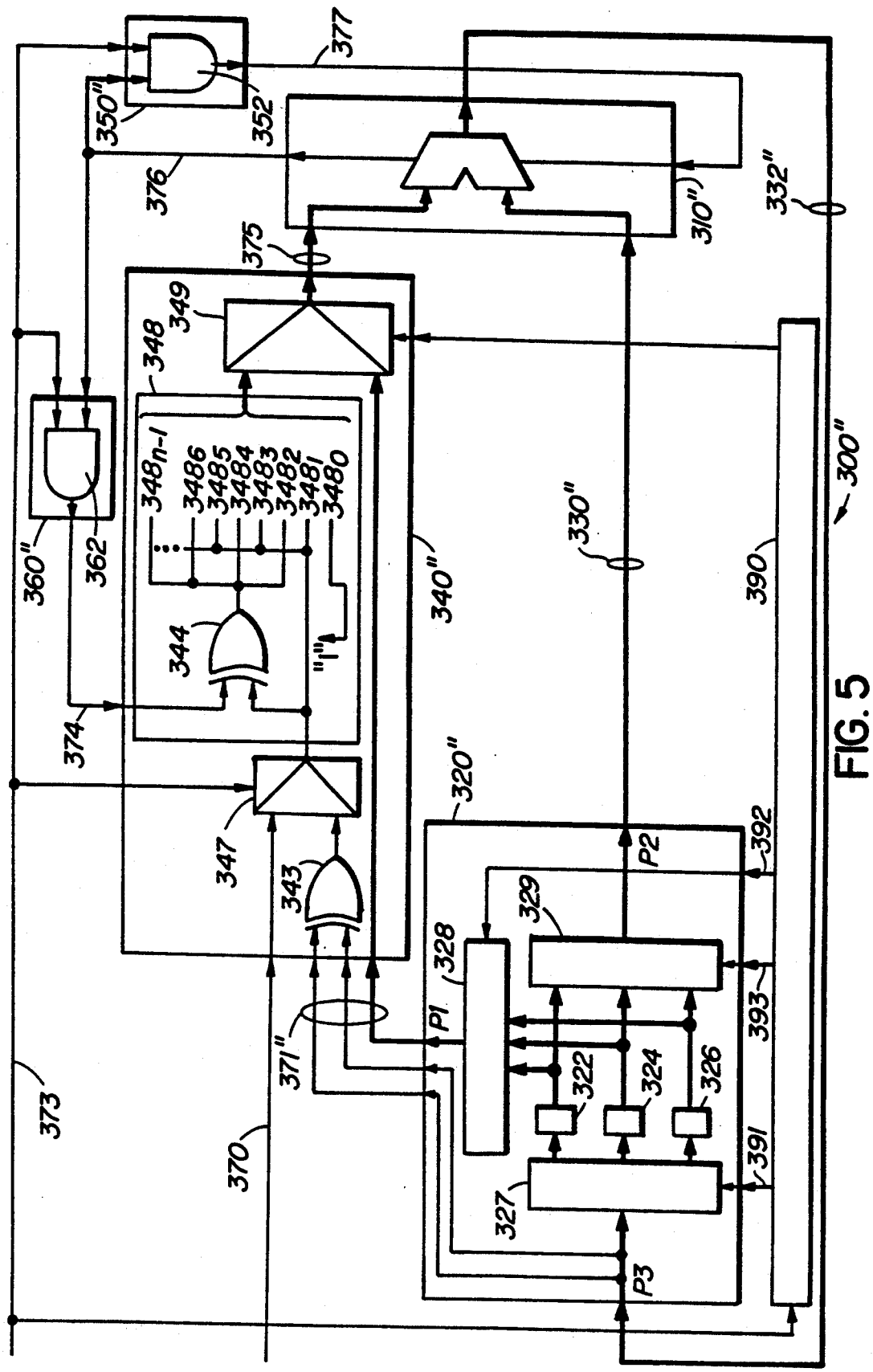
FIG. 5 is a block schematic diagram similar to FIG. 3 showing a second implementation for some of the functional blocks of FIG. 3.

Alternative implementations 310", 320", 340" of the adding apparatus 310, the storage apparatus 320 and the first combinational network 340 of the digital integrator 300 based on custom data path design are shown in FIG. 5. In this case, the adding apparatus comprises a single n-bit binary adder 310", the storage apparatus 320" comprises three n-bit registers 322, 324, 326, a write address decoder 327 and two read address decoders 328, 329, and the digital integrator 300" further comprises a finite state machine 390 for controlling interconnections of the single adder 310, and the registers 322, 324, 326 via the buses 330", 332" and the first combinational network 340" to implement the desired integration function.

The storage apparatus 320" is connected to an output port of the adder 310" by bus 332". The write address decoder 327 writes output words supplied by the adder 310" on bus 332" to the registers 322, 324, 326 selected according to write address signals supplied by the finite state machine 390 on a first control bus 391. The first read address decoder 328 reads words from the registers 322, 324, 326 selected according to first read address signals supplied by the finite state machine 390 on a second control bus 392 for application to the first combinational network 340" via bus 371". The second read address decoder 329 reads words from the registers 322, 324, 326 selected according to second read address signals supplied by the finite state machine 390 on a third control bus 393 for application to a first input port of the adder 310" via the bus 330". Two bits of each output word fed by the adder 310, to the write address decoder 327 are also fed to the first combinational network 340" on bus 371".

The first combinational network 340" comprises an exclusive-OR gate 343, a first multiplexor 347, a word generator 348 and a second multiplexor 349. The exclusive-OR gate 343 combines the two bits taken from each output word of the adder 310" to derive a test pattern signal. The first multiplexor 347 selects an external input signal received on input line 370 when the test mode signal on the test mode line 373 is a logical "0", and selects the test pattern signal when the test mode signal is a logical "1". The selected signal is applied to the word generator 348 which comprises an exclusive-OR gate 344 and n output terminals $348_0$–$348_{n-1}$. The output terminal $348_0$ corresponding to the least significant bit is permanently connected to a logical "1". Some of the other terminals $348_1$–$348_{n-1}$ are connected directly to the output of the first multiplexor 347, and the remaining terminals $348_1$–$348_{n-1}$ are connected to the output of the first multiplexor 347 via the exclusive-OR gate 344. The exclusive-OR gate 344 is also connected to the third combinational network 360" which applies a logical "0" to the exclusive-OR gate 344 when the test mode signal is a logical "0" and applies a carry-out bit of the adder 310" to the exclusive-OR gate 344 when the test mode signal is a logical "1". The resulting n-bit word is fed to the second multiplexor 349 which selects either that word or the word supplied by the first read address decoder 328 for application to a second input port of the adder 310" via bus 375 according to a control signal received on a fourth control bus 394.

The second combinational network 350" applies a carry-out bit of the adder 310" received on line 376 to a carry-in port of the adder 310" via line 377 when the test mode signal is a logical "1", blocking such feedback when the test mode signal is a logical "0".

The finite state machine 390 is programmed to perform the following sequence of instructions when the test mode signal is a logical "0", where P1 designates the port connected to the first read address decoder 328, P2 designates the port connected to the second read address decoder 329, P3 designates the port connected to the write address decoder, R1 designates register 322, R2 designates register 324, R3 designates register 326, and W designates the word generator 348:

| State | P3 | P2 | P1 | |
|---|---|---|---|---|
| S0: | R1: = | R1 + | W → | S1 |
| S1: | R2: = | R2 + | R1 → | S2 |
| S2: | R3: = | R3 + | R2 → | S0 |

These instructions provide a digital integration suitable for use in decimation of sigma-delta modulated signals.

When the test mode signal is a logical "1", however, the first multiplexor 347 selects the internally generated test pattern signal for application to the word generator 348, and the word generator 348 modifies the test pattern signal in response to the carry-out bit supplied by the third combinational network 360" to provide a suitably random test stimulus. The second combinational network 350" also activates internal test result compaction when the test mode signal is a logical "1".

The finite state machine 390 may be programmed to perform the same sequence of instructions in test mode as in normal operation mode. Some possible structural faults may not be detectable in this case as port P1 is never connected to register R3. However, as this connection is not required for normal operation of the digital integrator 300", a fault affecting this connection will not affect normal operation of the digital integrator 300".

However, if detection of all detectable structural faults is desired for improved system reliability, the finite state machine 390 can be made responsive to the test mode signal so as to execute the following set of instructions when the test mode signal is a logical "1":

| State | P3 | P2 | P1 | |
|---|---|---|---|---|
| S0: | R1: = | R1 + | W → | S1 |
| S1: | R2: = | R2 + | R1 → | S2 |
| S2: | R3: = | R3 + | R2 → | S3 |
| S3: | R1: = | R1 + | R1 → | S4 |
| S4: | R2: = | R1 + | R2 → | S5 |
| S5: | R3: = | R2 + | R3 → | S0 |

These and other modifications are within the scope of the invention as defined below.

We claim:

1. A self-testable digital integrator comprising:
   adding apparatus for performing binary addition of digital words and storage apparatus for storing digital words, the adding apparatus and the storage apparatus being functionally interconnected such that the storage apparatus feeds digital words to the adding apparatus for addition thereof and the adding apparatus feeds resulting digital words to the storage apparatus for storage thereof to perform a digital integration operation;
   a first combinational network responsive to a first state of a test mode signal to feed an external input signal to the adding apparatus for integration thereof, and responsive to a second state of the test mode signal to feed to the adding apparatus a test pattern signal derived from selected bits of the digital words fed from the adding apparatus to the storage apparatus; and
   a second combinational network responsive to the second state of the test mode signal to feed back a carry-out bit of the adding apparatus to a carry-in port of the adding apparatus, and responsive to the first state of the test mode signal to block such feedback.

2. A self-testable digital integrator as defined in claim 1, further comprising a third combinational network responsive to the second state of the test mode signal to feed a carry-out bit of the adding apparatus to the first combinational network, the first combinational network being responsive to the second state of the test mode signal and to the carry-out bit to modify the test pattern signal.

3. A self-testable digital integrator as defined in claim 1, wherein:
the adding apparatus comprises a chain of m n-bit binary adders and the storage apparatus comprises m corresponding n-bit registers, where m and n are positive integers;
a first of the adders has a first input port fed by the first combinational network, and each other adder has a first input port fed by an output port of an adjacent adder in the chain; and
each adder has a second input port fed by its corresponding register and an output port feeding its corresponding register.

4. A self-testable digital integrator as defined in claim 3, wherein the first combinational network comprises:
a first AND gate having a first input responsive to the external input signal and a second input responsive to an inversion of the test mode signal;
a first exclusive-OR gate having first and second inputs responsive to the selected bits of digital words fed from the adding apparatus to the storage apparatus;
a second AND gate having a first input responsive to an output of the first exclusive-OR gate and a second input responsive to the test mode signal;
an OR gate having a first input responsive to an output of the first AND gate and a second input responsive to an output of the second AND gate;
a second exclusive-OR gate having a first input responsive to an output of the OR gate and a second input responsive to the test mode signal; and
an output port comprising n output terminals, one of the terminals supplying a bit permanently fixed at logical "1", others of the terminals being connected to an output of the second exclusive-OR gate, and all remaining terminals being connected to the output of the OR gate.

5. A self-testable digital integrator as defined in claim 4, wherein each terminal of the output port supplies one bit of an n-bit word to the first input port of the first adder, the $0^{th}$ bit being supplied by the terminal fixed at logical "1", the terminals supplying the $p^{th}$ bits being connected to the output of the second exclusive-OR gate for every prime number value of p less than n, and all remaining terminals being connected to the output of the OR gate.

6. A self-testable digital integrator as defined in claim 4, wherein each terminal of the output port supplies one bit of an n-bit word to the first input port of the first adder, the $0^{th}$ bit being supplied by the terminal fixed at logical "1", the terminals supplying the $i^{th}$ bits being connected to the output of the second exclusive-OR gate for every even number value of i greater than 0 and less than n, and all remaining terminals being connected to the output of the OR gate.

7. A self-testable digital integrator as defined in claim 4, further comprising a third combinational network responsive to the second state of the test mode signal to feed a carry-out bit of an adder of the adding apparatus to the second input of the second exclusive-OR gate of the first combinational network, so that the second input of the second exclusive-OR gate of the first combinational network is responsive to both the test mode signal and the carry-out bit.

8. A self-testable digital integrator as defined in claim 7, wherein the third combinational network comprises an AND gate having a first input responsive to the test mode signal and a second input responsive to the carry-out bit.

9. A self-testable digital integrator as defined in claim 8, wherein the carry-out bit is supplied by a last adder in the chain of adders.

10. A self-testable digital integrator as defined in claim 4, wherein the second combinational network is responsive to the second state of the test mode signal to feed back a carry-out bit of a last adder in the chain of adders to a carry-in port of said last adder, and responsive to the first state of the test mode signal to block such feedback.

11. A self-testable digital integrator as defined in claim 10, wherein the second combinational network comprises an AND gate having a first input responsive to the test mode signal, a second input responsive to the carry-out bit and an output coupled to the carry-in port.

12. A self-testable digital integrator as defined in claim 1, further comprising a finite state machine, wherein:
the adding apparatus comprises a single n-bit binary adder, where n is a positive integer;
the storage apparatus comprises a plurality of n-bit registers, a write address decoder and two read address decoders, the write address decoder being responsive to a signal supplied by the finite state machine to write an output word supplied by the adder to a selected register, a first of the read address decoders being responsive to a signal supplied by the finite state machine to read a first word from a selected register for feeding to the first combinational network, and a second of the read address decoders being responsive to a signal supplied by the finite state machine to read a second word from a selected register for feeding to a first input port of the adder;
the first combinational network is responsive to a signal supplied by the finite state machine to select one of the first words supplied by the storage apparatus, a word derived from the external input signal and a word derived from the test pattern signal for application to a second input port of the adder; and
the finite state machine cycles the read and write address decoders and the multiplexor through a first series of states to perform a digital integration of the external input signal when the test mode signal is in its first state.

13. A self-testable digital integrator as defined in claim 12, wherein the finite state machine is responsive to the test mode signal to cycle the read and write address decoders through a second series of states for testing elements of the digital integrator when the test mode signal is in its second state.

14. A self-testable digital integrator as defined in claim 12, further comprising a third combinational network responsive to the second state of the test mode signal to feed a carry-out bit of the adder to the first combinational network, the first combinational network being responsive to the second state of the test mode signal and to the carry-out bit to modify the test pattern signal.

15. A self-testable digital integrator as defined in claim 12, wherein the second combinational network is responsive to the second state of the test mode signal to feed back a carry-out bit of the adder to a carry-in port of the adder, and responsive to the first state of the test mode signal to block such feedback.

16. A self-testable digital integrator as defined in claim 12, wherein the first combinational network comprises:
- at least one gate for combining the selected bits of the digital words fed from the adding apparatus to the storage apparatus to derive the test pattern signal;
- a word generator for generating n-bit words from 1-bit signals;
- a first multiplexor responsive to the first state of the test mode signal to feed the external input signal to the word generator and responsive to the second state of the test mode signal to feed the test pattern signal to the word generator; and
- a second multiplexor responsive to signals from the finite state machine for selecting between a word supplied by the word generator and the first word supplied by the storage apparatus for application to the second input port of the adder.

17. A self-testable digital integrator as defined in claim 16, further comprising a third combinational network responsive to the second state of the test mode signal to feed a carry-out bit of the adder to the word generator of the first combinational network, the word generator being responsive to the second state of the test mode signal and to the carry-out bit to modify the word derived from the test pattern signal.

18. A method for self-testing a digital integrator comprising adding apparatus for performing binary addition of digital words and storage apparatus for storing digital words, the adding apparatus and the storage apparatus being functionally interconnected such that the storage apparatus feeds digital words to the adding apparatus for addition thereof and the adding apparatus feeds resulting digital words to the storage apparatus for storage thereof to perform a digital integration operation, the method comprising deriving a test pattern signal from selected bits of digital words fed from the adding apparatus to the storage apparatus while feeding back a carry-out bit of the adding apparatus to a carry-in port of the adding apparatus and feeding the test pattern signal to the adding apparatus.

19. A method as defined in claim 18, further comprising altering the test pattern signal in response to a carry-out bit of the adding apparatus.

* * * * *